(12) United States Patent
Tazawa et al.

(10) Patent No.: US 12,272,927 B2
(45) Date of Patent: Apr. 8, 2025

(54) VERTICAL CAVITY SURFACE EMITTING DEVICE

(71) Applicant: STANLEY ELECTRIC CO., LTD., Tokyo (JP)

(72) Inventors: Komei Tazawa, Tokyo (JP); Seiichiro Kobayashi, Tokyo (JP); Yusuke Yokobayashi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 639 days.

(21) Appl. No.: 17/624,159

(22) PCT Filed: Jun. 17, 2020

(86) PCT No.: PCT/JP2020/023747
§ 371 (c)(1),
(2) Date: Dec. 30, 2021

(87) PCT Pub. No.: WO2021/002198
PCT Pub. Date: Jan. 7, 2021

(65) Prior Publication Data
US 2022/0368107 A1 Nov. 17, 2022

(30) Foreign Application Priority Data
Jul. 1, 2019 (JP) .................................. 2019-123060

(51) Int. Cl.
*H01S 5/00* (2006.01)
*H01S 5/042* (2006.01)
(Continued)

(52) U.S. Cl.
CPC ...... *H01S 5/06817* (2013.01); *H01S 5/04253* (2019.08); *H01S 5/18308* (2013.01);
(Continued)

(58) Field of Classification Search
CPC ............. H01S 5/06817; H01S 5/04253; H01S 5/18308; H01S 5/18361; H01S 5/18369;
(Continued)

(56) References Cited

U.S. PATENT DOCUMENTS 6,751,245 B1 6/2004 Wasserbauer et al.
8,861,562 B2 10/2014 Suzuki et al.
(Continued)

FOREIGN PATENT DOCUMENTS

JP H05175615 A 7/1993
JP H09018084 A 1/1997
(Continued)

OTHER PUBLICATIONS

U.S. Appl. No. 17/432,466; First Named Inventor: Masaru Kuramoto; Title: "Vertical Cavity Surface Emitting Device"; filed Aug. 19, 2021.
(Continued)

*Primary Examiner* — Kinam Park
(74) *Attorney, Agent, or Firm* — Holtz, Holtz & Volek PC

(57) ABSTRACT

A vertical cavity surface emitting device includes a substrate, a first multilayer film reflecting mirror, a first semiconductor layer having a first conductivity type, a light-emitting layer, a second semiconductor layer having a second conductivity type opposite of the first conductivity type, and having an upper surface with a projection, an insulating layer that covers the upper surface of the second semiconductor layer and has an opening that exposes the second semiconductor layer on the upper surface of the projection terminated on the upper surface of the projection of the second semiconductor layer, a transmissive electrode layer that covers the upper surface of the second semiconductor layer exposed from the opening of the insulating layer and is formed on the insulating layer, and a second (Continued)

multilayer film reflecting mirror formed on the transmissive electrode layer and constituting a resonator together with the first multilayer film reflecting mirror.

5 Claims, 4 Drawing Sheets

(51) Int. Cl.
 *H01S 5/068* (2006.01)
 *H01S 5/183* (2006.01)
(52) U.S. Cl.
 CPC ...... *H01S 5/18361* (2013.01); *H01S 5/18369* (2013.01); *H01S 5/18391* (2013.01); *H01S 5/18327* (2013.01); *H01S 2301/166* (2013.01)
(58) Field of Classification Search
 CPC ............. H01S 5/18391; H01S 5/18327; H01S 2301/166
 See application file for complete search history.

(56) References Cited

U.S. PATENT DOCUMENTS

| | | | |
|---|---|---|---|
| 9,231,163 B2 | 1/2016 | Miyachi et al. | |
| 9,735,544 B2 | 8/2017 | Tazawa et al. | |
| 9,787,059 B2 | 10/2017 | Tazawa et al. | |
| 9,935,427 B2 | 4/2018 | Tazawa et al. | |
| 9,935,428 B2 | 4/2018 | Tanaka et al. | |
| 9,972,972 B2 | 5/2018 | Tazawa et al. | |
| 10,164,409 B2 | 12/2018 | Rackow et al. | |
| 10,381,804 B2 | 8/2019 | Tazawa et al. | |
| 10,483,721 B2 | 11/2019 | Tazawa et al. | |
| 2014/0294030 A1* | 10/2014 | Tamanuki | H01S 5/0653 372/50.11 |
| 2017/0331258 A1 | 11/2017 | Tazawa et al. | |
| 2018/0366906 A1* | 12/2018 | Hamaguchi | H01S 5/028 |
| 2019/0173262 A1 | 6/2019 | Ono et al. | |
| 2019/0267774 A1* | 8/2019 | Sato | H01S 5/0267 |
| 2019/0363515 A1 | 11/2019 | Kuramoto et al. | |
| 2021/0104870 A1 | 4/2021 | Sato et al. | |
| 2021/0384706 A1 | 12/2021 | Kuramoto et al. | |
| 2022/0045476 A1* | 2/2022 | Fujii | H01S 5/18369 |
| 2023/0055932 A1 | 2/2023 | Sato et al. | |

FOREIGN PATENT DOCUMENTS

| | | |
|---|---|---|
| JP | 5839852 B2 | 1/2016 |
| JP | 2017098328 A | 6/2017 |
| WO | 2005074080 A1 | 8/2005 |
| WO | 2017018017 A1 | 2/2017 |
| WO | 2018037747 A1 | 3/2018 |
| WO | 2018083877 A1 | 5/2018 |

OTHER PUBLICATIONS

U.S. Appl. No. 17/432,470; First Named Inventor: Masaru Kuramoto; Title: "Vertical Cavity Surface Emitting Device"; filed: Aug. 19, 2021.

Chinese Office Action (and an English language translation thereof) dated Jan. 16, 2024, issued in counterpart Chinese Application No. 202080048727.0.

International Search Report (ISR) (and English language translation thereof) dated Sep. 8, 2020, issued in International Application No. PCT/JP2020/023747.

Written Opinion Sep. 8, 2020, issued in International Application No. PCT/JP2020/023747.

Extended European Search Report (EESR) dated Jun. 2, 2023, issued in counterpart European Application No. 22184252.9.

Kuramoto, et al., "Enhancement of slope efficiency and output power in GaN-based vertical-cavity surface-emitting asers with a Si02-buried lateral index guide", Applied Physics Letters vol. 112.

* cited by examiner

VERTICAL CAVITY SURFACE EMITTING DEVICE

TECHNICAL FIELD

The present invention relates to a vertical cavity surface emitting device, such as a vertical cavity surface emitting laser.

BACKGROUND ART

The vertical cavity surface emitting laser (hereinafter simply referred to as a surface emitting laser) is a semiconductor laser that includes reflecting mirrors formed of multilayer films stacked on a substrate and emits light in a direction perpendicular to a surface of the substrate. For example, Patent Document 1 discloses a surface emitting laser element configured to reduce the generation of a high-order transverse mode.

Patent Document 1: Japanese Patent No. 5839852

DISCLOSURE OF THE INVENTION

Problems to be Solved by the Invention

For example, in the vertical cavity surface emitting device, such as the surface emitting laser, it is preferred that a light emission pattern is stable. Accordingly, for example, a resonator configured to generate light in a desired transverse mode is preferably configured in the vertical cavity surface emitting device. For example, the surface emitting laser preferably generates a laser beam having a monomodal intensity distribution and is configured to emit the laser beam at a low emission angle.

The present invention has been made in consideration of the above-described points and an object of which is to provide a vertical cavity surface emitting device that allows emitting light in a stable transverse mode.

Solutions to the Problems

A vertical cavity surface emitting device according to the present invention includes a substrate, a first multilayer film, a first semiconductor layer, a light-emitting layer, a second semiconductor layer, an insulating layer, a transmissive electrode layer, and a second multilayer film reflecting mirror. The first multilayer film reflecting mirror is formed on the substrate. The first semiconductor layer is formed on the first multilayer film reflecting mirror. The first semiconductor layer has a first conductivity type. The light-emitting layer is formed on the first semiconductor layer. The second semiconductor layer is formed on the light-emitting layer. The second semiconductor layer has a second conductivity type opposite of the first conductivity type. The second semiconductor layer has an upper surface with a projection. The insulating layer covers the upper surface of the second semiconductor layer. The insulating layer has an opening that exposes the second semiconductor layer on the upper surface of the projection terminated on the upper surface of the projection. The transmissive electrode layer that covers the upper surface of the second semiconductor layer exposed from the opening of the insulating layer. The transmissive electrode layer is formed on the insulating layer, and a second multilayer film reflecting mirror is formed on the transmissive electrode layer. The second multilayer film reflecting mirror constitutes a resonator together with the first multilayer film reflecting mirror.

DESCRIPTION OF PREFERRED EMBODIMENTS

The following will describe embodiments of the present invention in detail. In the following embodiments, a case where the present invention is embodied as a surface emitting laser (semiconductor laser) will be described. However, the present invention is not limited to the surface emitting laser but applicable to various kinds of vertical cavity surface emitting devices, such as a vertical cavity surface emitting diode.

Embodiment 1

Figure 1:
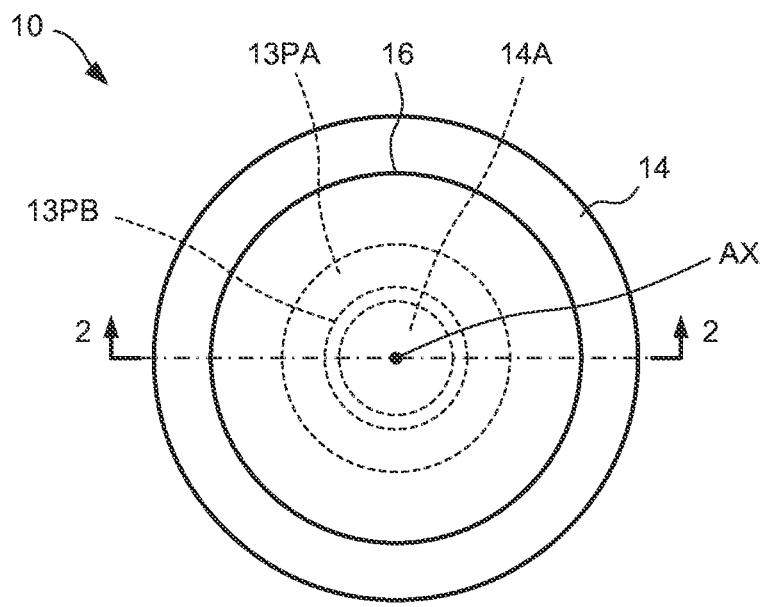
FIG. 1 is a top view of a surface emitting laser according to Embodiment 1.
Figure 2:
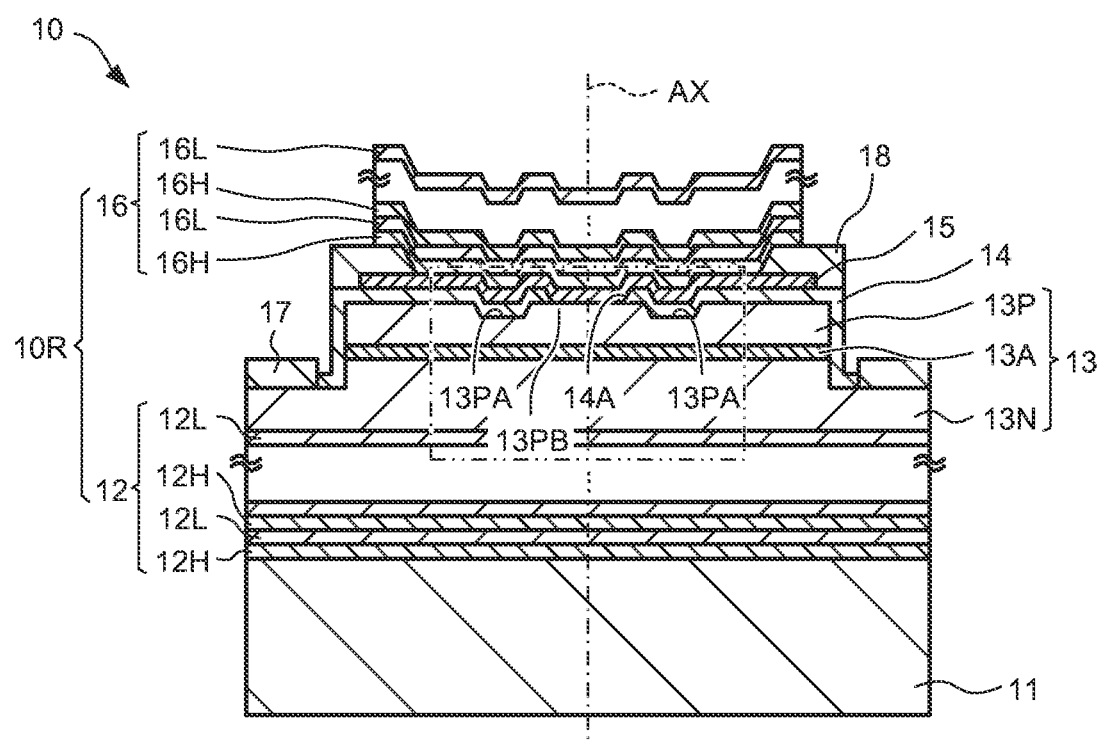
FIG. 2 is a cross-sectional view of the surface emitting laser according to Embodiment 1.

FIG. 1 is a schematic top view of a Vertical Cavity Surface Emitting Laser (hereinafter referred to as a surface emitting laser: VCSEL) according to Embodiment 1. FIG. 2 is a cross-sectional view of a surface emitting laser 10. FIG. 2 is a cross-sectional view taken along the line 2-2 in FIG. 1. The configuration of the surface emitting laser 10 will be described with reference to FIG. 1 and FIG. 2.

The surface emitting laser 10 includes a substrate 11 and a first multilayer film reflecting mirror (hereinafter simply referred to as a first reflecting mirror) 12 formed on the substrate 11. In this embodiment, the first reflecting mirror has a structure in which first semiconductor films (hereinafter referred to as high refractive index semiconductor films) H1 and second semiconductor films (hereinafter referred to as low refractive index semiconductor films) L1 having a refractive index lower than that of the high refractive index semiconductor film H1 are stacked in alternation. In this embodiment, the first reflecting mirror 12 constitutes a Distributed Bragg Reflector (DBR) made of a semiconductor material.

In this embodiment, the substrate 11 has a composition of GaN. The substrate 11 is, for example, a substrate for growth used for crystal growth of the first reflecting mirror 12. The high refractive index semiconductor film H1 in the first reflecting mirror 12 has a composition of GaN, and the low refractive index semiconductor film L1 has a composition of AlInN. In this embodiment, between the substrate 11 and the first reflecting mirror 12, a buffer layer (not illustrated) having a composition of GaN is disposed.

The surface emitting laser 10 includes a light-emitting structure layer 13 formed on the first reflecting mirror 12 and including a light-emitting layer 13A. In this embodiment, the light-emitting structure layer 13 includes a plurality of semiconductor layers made of a nitride-based semiconductor. For example, the light-emitting structure layer 13 includes a n-type semiconductor layer (a first semiconductor layer having a first conductivity type) 13N formed on the first reflecting mirror 12, the light-emitting layer (an active layer) 13A formed on the n-type semiconductor layer 13N, and a p-type semiconductor layer (a second semiconductor layer, a semiconductor layer having a second conductivity type opposite of that of the first conductivity type) 13P formed on the light-emitting layer 13A.

In this embodiment, the n-type semiconductor layer 13N has a composition of GaN and contains Si as n-type impurities. The light-emitting layer 13A has a quantum well structure that includes a well layer having a composition of InGaN and a barrier layer having a composition of GaN. The p-type semiconductor layer 13P has a GaN-based composition and contains Mg as p-type impurities.

The configuration of the light-emitting structure layer 13 is not limited to this. For example, the n-type semiconductor layer 13N may include a plurality of n-type semiconductor layers having mutually different compositions. The light-emitting layer 13A may have a single quantum well structure or may have a single layer structure.

The p-type semiconductor layer 13P may have a plurality of p-type semiconductor layers having mutually different compositions. For example, the p-type semiconductor layer 13P may include a contact layer (not illustrated) to form an ohmic contact with an electrode. In this case, for example, the p-type semiconductor layer 13P only needs to include a GaN layer as a cladding layer between the contact layer and the light-emitting layer 13A.

The light-emitting structure layer 13 may have, for example, an electron-blocking layer (not illustrated) that reduces an overflow of electrons injected into the light-emitting layer 13A to the p-type semiconductor layer 13P between the light-emitting layer 13A and the p-type semiconductor layer 13P. For example, the electron-blocking layer may have a composition of AlGaN. The electron-blocking layer may contain impurities, for example, and may contain the p-type impurities to have a p-type conductivity type.

The p-type semiconductor layer 13P has a recess 13PA disposed into a ring shape on an upper surface. As illustrated in FIG. 1, in this embodiment, the recess 13PA is formed into a circular ring shape. In this embodiment, the p-type semiconductor layer 13P has a layer thickness smaller than those of the other regions in the region of the recess 13PA.

For example, the recess 13PA can be formed by, after growing a GaN layer that is to be the light-emitting structure layer 13 on the substrate 11, forming a mask in a circular ring shape on a surface thereof, and performing etching over the mask.

In this embodiment, since the ring-shaped recess 13PA is formed on the upper surface of the p-type semiconductor layer 13P, a projection 13PB that relatively projects with respect to the recess 13PA is formed inside the recess 13PA. The p-type semiconductor layer 13P has a layer thickness larger than that of the region of the recess 13PA in the region of the projection 13PB. In other words, the projection 13PB of the p-type semiconductor layer 13P is a part defined by an inner end portion of the recess 13PA.

The surface emitting laser 10 includes an insulating layer 14 that exposes a part of the projection 13PB of the p-type semiconductor layer 13P and is formed on the upper surface of the p-type semiconductor layer 13P. In this embodiment, the insulating layer 14 has an opening 14A that is coaxial to the projection 13PB (the recess 13PA) and has a diameter smaller than an outer diameter of the projection 13PB. For example, in this embodiment, the opening 14A of the insulating layer 14 has a side surface shape in a conical shape that narrows toward the p-type semiconductor layer 13P.

The upper surface of the p-type semiconductor layer 13P is not covered with the insulating layer 14 in the opening 14A of the insulating layer 14. Accordingly, in this embodiment, an outer periphery portion of an upper surface of the projection 13PB on the p-type semiconductor layer 13P is covered with the insulating layer 14. On the other hand, a center portion of the upper surface of the projection 13PB on the p-type semiconductor layer 13P is exposed from the insulating layer 14.

In this embodiment, the light-emitting structure layer 13 has a portion from which the p-type semiconductor layer 13P and the light-emitting layer 13A, and a part of the n-type semiconductor layer 13N are removed until an upper surface of the n-type semiconductor layer 13N is exposed. The insulating layer 14 is formed to cover the portion exposed by the removal on the n-type semiconductor layer 13N and a side surface exposed the removal on the light-emitting layer 13A and the p-type semiconductor layer 13P.

The insulating layer 14 has translucency to the light emitted from the light-emitting layer 13A, and has a refractive index lower than that of the p-type semiconductor layer 13P. For example, the insulating layer 14 is made of a transmissive oxide layer, such as $SiO_2$.

The surface emitting laser 10 has a transmissive electrode layer 15 that covers the upper surface of the p-type semiconductor layer 13P exposed from the opening 14A and is formed on the insulating layer 14. The transmissive electrode layer 15 has translucency to the light emitted from the light-emitting layer 13A, and has a conductive property. The transmissive electrode layer 15 is electrically connected to the p-type semiconductor layer 13P (the light-emitting structure layer 13) via the opening 14A. In this embodiment, the transmissive electrode layer 15 is in contact with an upper surface of the insulating layer 14 and the upper surface of the projection 13PB of the p-type semiconductor layer 13P. For example, the transmissive electrode layer 15 is made of a metal oxide film, such as ITO or IZO.

The region covered with the insulating layer 14 on the upper surface of the p-type semiconductor layer 13P is a region that has a high electrical resistance compared with that in the region exposed from the opening 14A. The current applied to the transmissive electrode layer 15 is injected into the light-emitting structure layer 13 from the region where the transmissive electrode layer 15 comes into contact with the p-type semiconductor layer 13P via the opening 14A of the insulating layer 14.

That is, the insulating layer 14 has a function to restrict (confine) the current injected to the light-emitting structure layer 13. The opening 14A of the insulating layer 14 forms a region (a current path) into which the current to the light-emitting structure layer 13 is injected.

The surface emitting laser 10 includes a second multilayer film reflecting mirror (hereinafter simply referred to as a second reflecting mirror) 16 formed on the transmissive electrode layer 15. The second reflecting mirror 16 is arranged opposed to the first reflecting film 12 across the light-emitting structure layer 13. The second reflecting mirror 16 constitutes a resonator 10R having a resonator length direction in a direction perpendicular to the light-emitting structure layer 13 (a direction perpendicular to the substrate 11) together with the first reflecting mirror 12.

In this embodiment, the second reflecting mirror 16 has a structure in which first dielectric films (hereinafter referred to as high refractive index dielectric films) H2 and second dielectric films (hereinafter referred to as low refractive index dielectric films) L2 having a refractive index lower than that of the high refractive index dielectric film H2 are stacked in alternation.

In this embodiment, the second reflecting mirror 16 constitutes a distributed bragg reflector made of a dielectric material. For example, in this embodiment, the high refractive index dielectric film H2 is made of a $Nb_2O_5$ layer and the low refractive index dielectric film L2 is made of a $SiO_2$ layer. In this embodiment, the second reflecting mirror 16 has a shape of a column shape. Accordingly, in this embodiment, the surface emitting laser 10 has the column-shaped resonator 10R.

The surface emitting laser 10 includes first and second electrodes 17 and 18 that apply a current to the light-emitting structure layer 13. In this embodiment, the insulating layer has the opening on the upper surface from which the light-emitting layer 13A of the n-type semiconductor layer 13N and the p-type semiconductor layer 13P are removed. The first electrode 17 is formed on the upper surface exposed from the opening of the insulating layer 14 on the n-type semiconductor layer 13N. The second electrode 18 is formed on the insulating layer 14 and the transmissive electrode layer 15.

When the current is applied between the first and second electrodes 17 and 18, a light is emitted from the light-emitting layer 13A of the light-emitting structure layer 13. The light emitted from the light-emitting layer 13A is repeatedly reflected between the first and second reflecting mirrors 12 and 16 to reach a resonant state (perform a laser oscillation).

In this embodiment, the first reflecting mirror 12 has reflectivity slightly lower than that of the second reflecting mirror 16. Accordingly, a part of the light resonated between the first and second reflecting mirrors 12 and 16 transmits the first reflecting mirror 12 and the substrate 11 to be taken out to the outside. Thus, the surface emitting laser 10 emits the light in a direction perpendicular to the substrate 11 and the light-emitting structure layer 13.

The opening 14A of the insulating layer 14 defines a luminescence center as a center of a luminescence region in the light-emitting structure layer 13 to define a central axis (hereinafter referred to as a luminescence central axis) AX of the resonator 10R. The central axis AX of the resonator 10R passes through the center of the projection 13PB of the p-type semiconductor layer 13P to extend along a direction perpendicular to the p-type semiconductor layer 13P (the light-emitting structure layer 13).

The luminescence region of the light-emitting layer 13A means, for example, a region of a predetermined width from which a light having a predetermined intensity or more is emitted in the light-emitting layer 13A, and the center of luminescence region is the luminescence center. For example, the luminescence region of the light-emitting layer 13A means a region into which a current of a predetermined density or more is injected in the light-emitting layer 13A, and the center of luminescence region is the luminescence center. A straight line that passes through the luminescence center and is perpendicular to the substrate 11 is the luminescence central axis AX. The luminescence central axis AX is a straight line that extends along the resonator length direction of the resonator 10R constituted of the first and second reflecting mirrors 12 and 16. The luminescence central axis AX corresponds to an optical axis of a laser beam emitted from the surface emitting laser 10.

Here, an exemplary configuration of each layer in the surface emitting laser 10 will be described. In this embodiment, the first reflecting mirror 12 is made of 40 to 50 pairs of GaN layers and AlInN layers. The second reflecting mirror 16 is made of 5 to 15 pairs of $SiO_2$ layers and $Nb_2O_5$ layers. Each of the films inside the first and second reflecting mirrors 12 and 16 has an optical film thickness of a quarter of the wavelength of the light emitted from the light-emitting layer 13A.

In this embodiment, a high refractive index dielectric film 16H on a side closest to the transmissive electrode layer 15 in the second reflecting mirror 16 is formed as a layer for adjusting a wavelength (a phase) of the resonant light inside the resonator 10R, and, for example, has a layer thickness smaller than those of the other high refractive index dielectric films 16H. Each of the dielectric films except for this high refractive index dielectric film 16H at the lowermost layer is a part functioning as a reflecting mirror.

The n-type semiconductor layer 13N has a layer thickness of 500 to 2000 nm. The light-emitting layer 13A is made of two to five pairs of InGaN layers and GaN layers, and has a layer thickness of 20 to 50 nm as a whole. In this embodiment, the light-emitting layer 13A emits a light in a wavelength region of a blue color, for example, a light with a wavelength of approximately 410 to 470 nm. The p-type semiconductor layer 13P has a layer thickness of 40 to 90 nm.

The recess 13PA of the p-type semiconductor layer 13P has a depth of 10 to 30 nm, for example, has a depth of 20 nm. The recess 13PA of the p-type semiconductor layer 13P has an outer diameter of 15 to 20 μm and an inner diameter of 5 to 10 μm. That is, the projection 13PB of the p-type semiconductor layer 13P has an outer diameter of 5 to 10 μm.

The insulating layer 14 has a layer thickness of 10 to 30 nm, for example, has a layer thickness of 20 nm. The opening 14A of the insulating layer 14 has an outer diameter of 4 to 8 μm. The transmissive electrode layer 15 has a layer thickness of 10 to 30 nm, for example, has a layer thickness of 20 nm.

Figure 3:
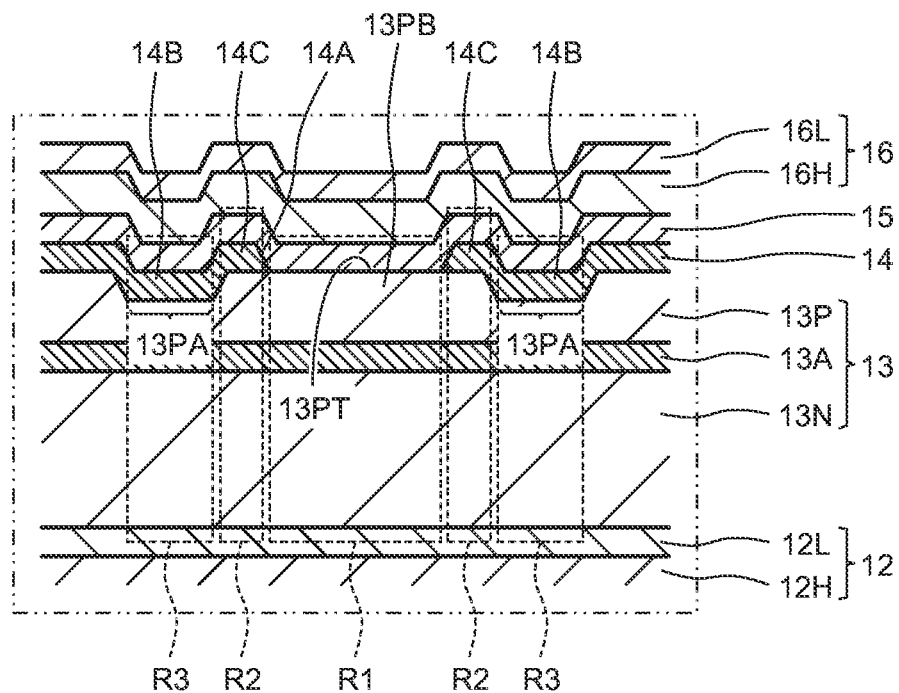
FIG. 3 is an enlarged cross-sectional view of the surface emitting laser according to Embodiment 1.
Figure 4:
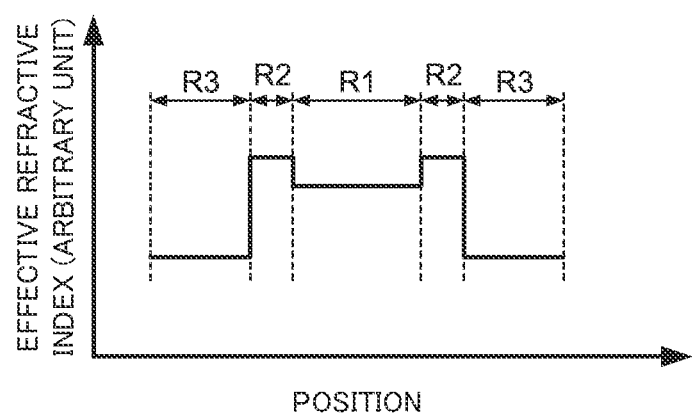
FIG. 4 is a drawing illustrating a distribution of a refractive index in a laser medium in the surface emitting laser according to Embodiment 1.

FIG. 3 is an enlarged cross-sectional view of the proximity of the light-emitting structure layer 13. FIG. 3 is a drawing enlarging and illustrating a part enclosed by the two-dot chain line in FIG. 2. FIG. 4 is a drawing illustrating distribution of effective refractive indexes of regions inside the resonator 10R. With reference to FIG. 3 and FIG. 4, the optical property inside the resonator 10R will be described.

In this embodiment, the light-emitting structure layer 13 has the ring-shaped recess 13PA on the upper surface of the p-type semiconductor layer 13P. The insulating layer 14 is formed on the upper surface of the p-type semiconductor layer 13P including the recess 13PA, except for the region of the opening 14A disposed at the central portion of the projection 13PB of the p-type semiconductor layer 13P.

Accordingly, the insulating layer 14 has a first part 14B formed on a bottom portion of the recess 13PA of the p-type semiconductor layer 13P and a second part 14C formed to run over an outer periphery portion of an upper surface 13PT of the projection 13PB. The opening 14A of the insulating layer 14 is formed on the upper surface 13PT of the projection 13PB. The transmissive electrode layer 15 is formed on the region of the upper surface 13PT of the projection 13PB of the p-type semiconductor layer 13P exposed from the opening 14A of the insulating layer 14 and the first and second parts 14B and 14C of the insulating layer 14.

Accordingly, as illustrated in FIG. 3, in this embodiment, a column-shaped region (hereinafter referred to as a central region) R1 is formed between the first and second reflecting mirrors 12 and 16 as a stacked whole body from the n-type semiconductor layer 13N to the transmissive electrode layer 15 through the light-emitting layer 13A and the projection 13PB of the p-type semiconductor layer 13P. The core region R1 is a region that functions as a laser medium generating a standing wave that becomes a resonant light inside the resonator 10R.

In this embodiment, a cylindrical-shaped region (hereinafter referred to as an inside ring-shaped region) R2 that annularly surrounds a side portion of the core region R1 is formed between the first and second reflecting mirrors 12 and 16 as a stacked whole body from the n-type semiconductor layer 13N to the insulating layer 14 and the transmissive electrode layer 15 through the light-emitting layer 13A and the projection 13PB of the p-type semiconductor layer 13P. The inside ring-shaped region R2 functions, together with the central region R1, as a core region to which the standing wave inside the resonator 10R is waveguided.

In this embodiment, a cylindrical-shaped region (hereinafter referred to as an outside ring-shaped region) R3 that annularly surrounds a side portion of the inside ring-shaped region R2 is formed between the first and second reflecting mirrors 12 and 16 as a stacked whole body from the n-type semiconductor layer 13N to the insulating layer 14 and the transmissive electrode layer 15 through the light-emitting layer 13A and the recess 13PA of the p-type semiconductor layer 13P. The outside ring-shaped region R3 functions as a clad region that confines the standing wave inside the resonator 10R in the central region R1 and the inside ring-shaped region R2.

More specifically, in this embodiment, the insulating layer 14 has a refractive index lower than that of the p-type semiconductor layer 13P. The n-type semiconductor layer 13N, the light-emitting layer 13A, and the transmissive electrode layer 15 have the identical layer thickness over the central region R1, the inside ring-shaped region R2, and the outside ring-shaped region R3.

Accordingly, in this embodiment, as illustrated in FIG. 4, an effective refractive index (an equivalent refractive index as a whole body in consideration of the refractive indexes and the layer thicknesses of the respective layers) of the central region R1 is lower than an effective refractive index of the inside ring-shaped region R2. On the other hand, an effective refractive index of the outside ring-shaped region R3 is lower than the effective refractive indexes of the central region R1 and the inside ring-shaped region R2.

This causes the laser beam generated in the central region R1 to be partially waveguided (enter) to the inside ring-shaped region R2 and to be confined inside the central region R1 and the inside ring-shaped region R2. The laser beam waveguided into the inside ring-shaped region R2 attenuates due to a waveguide loss (a transmission loss).

That is, since the inside ring-shaped region R2 having an effective refractive index higher than that of the central region R1 is disposed in the outer periphery portion of the central region R1, there is disposed apart where the waveguide loss is generated at an interface between the central region R1 and the outside ring-shaped region R3. This substantially reduces a generation of a high-order transverse mode inside the resonator 10R.

Specifically, the high-order transverse mode is often generated in the outer periphery portion of the laser oscillation region (the central region R1 in this embodiment). In contrast to this, in this embodiment, the inside ring-shaped region R2 as a region to generate an intentional waveguide loss is disposed in the outer periphery portion of the central region R1. Accordingly, the light intensity is lowered in the outer periphery portion of the central region R1, and thus, the laser oscillation is less likely to occur. This reliably reduces the generation of the high-order transverse mode in the outer periphery portion of the central region R1, and, for example, a laser beam of a single transverse mode can be emitted.

For example, the width of the central region R1 corresponds to the opening diameter of the opening 14A of the insulating layer 14, and, for example, is approximately 5 to 10 μm, and is, for example, 7.5 μm. For example, the width (the ring width) of the inside ring-shaped region R2 is 0.5 to 2 μm, and is, for example, 0.5 μm.

Figure 5:
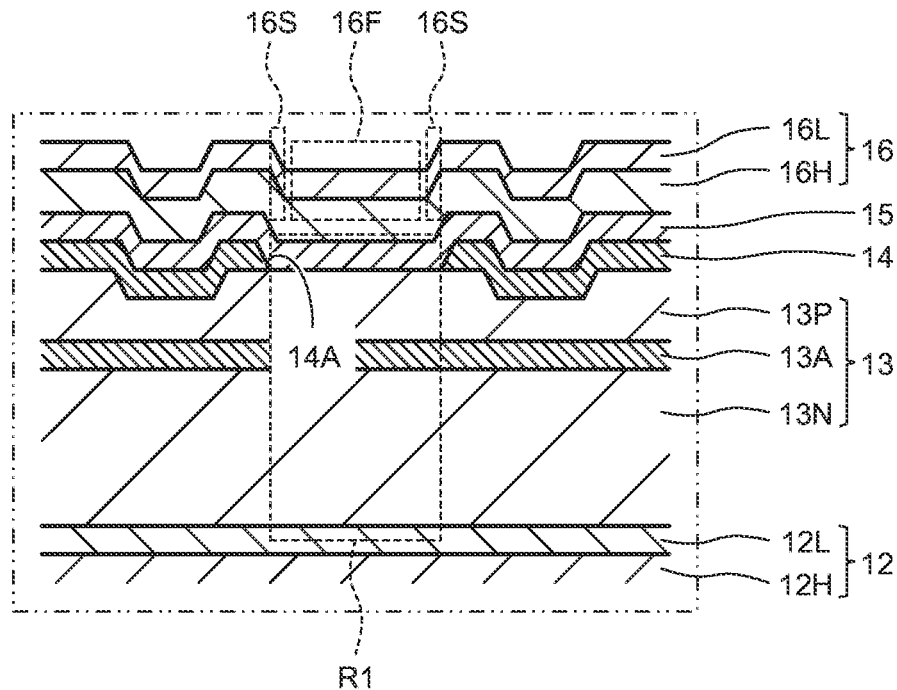
FIG. 5 is an enlarged cross-sectional view of the surface emitting laser according to Embodiment 1.

FIG. 5 is a cross-sectional view similar to FIG. 3. With reference to FIG. 5, a configuration of the second reflecting mirror 16 will be described. As described above, the central region R1 in which the insulating layer 14 is not formed and the inside ring-shaped region R2 in which the insulating layer 14 is formed are formed on the projection 13PB of the p-type semiconductor layer 13P. Forming the transmissive electrode layer 15 so as to cover this projection 13PB of the p-type semiconductor layer 13P and the insulating layer 14 forms a step that takes on the shape of the insulating layer 14 in the second reflecting mirror 16.

Specifically, the second reflecting mirror 16 has a region (hereinafter referred to as a flat region) 16F where the high refractive index dielectric film 16H and a low refractive index dielectric film 16L are formed to be flat (parallel to the transmissive electrode layer 15) and stacked on the central portion of the region (the central region R1) on the opening 14A of the insulating layer 14 and a region (hereinafter referred to as an inclined region) 16S where the high refractive index dielectric film 16H and the low refractive index dielectric film 16L are inclined and stacked on the outer periphery portion of the central region R1.

In other words, the second reflecting mirror 16 has the inclined region 16S that is formed on the region inside the opening 14A of the insulating layer 14 and in which the multilayer films are inclined due to the side surface shape of the opening 14A and stacked. This inclined region 16S of the second reflecting mirror 16 is a region having reflectivity lower than that of the flat region 16F. Accordingly, the light entering the inclined region 16S of the second reflecting mirror 16 is attenuated by a mirror loss (a reflection loss). Accordingly, in the region of the central region R1 corresponding to the inclined region 16S, the optical intensity is lowered, and thus, the laser oscillation is less likely to occur.

In other words, at the proximity of the central region R1 as the region to perform the laser oscillation within the resonator 10R, the inside ring-shaped region R2 (see FIG. 3) is disposed as the region to cause the waveguide loss and the inclined region 16S is disposed as the region to cause the mirror loss. Disposing these two loss regions reliably reduces the generation of the high-order transverse mode.

In particular, the vertical cavity-type light emitting element, such as the surface emitting laser 10 has an unstable transverse mode when large current driving is performed to achieve a high output power, and thus, the high-order transverse mode is likely to be generated. In this embodiment, adjacently disposing these two loss regions ensure obtaining the high output power and the stabilized transverse mode at the same time.

In this embodiment, the opening 14A of the insulating layer 14 has a side surface shape that narrows toward the p-type semiconductor layer 13P (the light-emitting structure layer 13). Accordingly, stacking the transmissive electrode layer 15 and the second reflecting mirror 16 (the high refractive index dielectric film 16H and the low refractive index dielectric film 16L) on this insulating layer 14 causes the step generated in these layers to be formed at a position slightly inward of the opening 14A of the insulating layer 14.

In other words, when the central region R1 is viewed along the luminescence central axis AX, the inclined region 16S of the second reflecting mirror 16 is formed inside the outer periphery portion of the central region R1. With this, the inclined region 16S can reliably provide the mirror loss to the standing wave generated in the central region R1.

For example, if the inclined region 16S is formed outside the central region R1, for example, on the inside ring-shaped region R2 or the outside ring-shaped region R3, the loss can hardly be provided to the standing wave in the central region R1 in some cases. For example, also when the position of the step of the high refractive index dielectric film 16H and the low refractive index dielectric film 16L that serves as the inclined region 16S is partially displaced from the region on the central region R1, a desired mirror loss cannot be provided in some cases.

In contrast to this, in this embodiment, the opening 14A of the insulating layer 14 has a taper-shaped opening as described above, and thus, the inclined region 16S of the second reflecting mirror 16 can be disposed at a position that reliably causes the mirror loss. For example, the inclined region 16S is a region having a width of 0.25 to 1.0 μm in the outer periphery portion of the region on the central region R1, and is, for example, a region having a width of 0.25 μm in the outer periphery portion of the outer periphery portion of the central region R1 of 7.5 μm.

In this embodiment, the projection 13PB formed by the side surface inside the recess 13PA of the p-type semiconductor layer 13 has a tapered shape toward the transmissive electrode layer 15. The insulating layer 14 and the transmissive electrode layer 15 are formed on the projection 13PB in this side surface shape. This stably forms the transmissive electrode layer 15 without fracture, and thus, the electrical performance of the surface emitting laser 10 is stabilized.

Specifically, the transmissive electrode layer 15 has a property to absorb a part of the standing wave inside the resonator 10R in some cases. Accordingly, the transmissive electrode layer 15 is preferred to be thin as long as the electrical performance can be ensured. On the other hand, in this embodiment, since the transmissive electrode layer 15 is formed on the entire opening 14A of the insulating layer 14 in addition to the recess 13PA and the projection 13PB, the transmissive electrode layer 15 has a step caused by this unevenness. Accordingly, in order to exhibit the stable electrical performance, for example, even when the large current driving is performed, it is necessary that the transmissive electrode layer 15 to be formed with a certain thickness to prevent disconnection and the like.

In contrast to this, since the recess 13PA and the projection 13PB are formed in such a side surface shape and the insulating layer 14 is formed on these recess 13PA and projection 13PB, the stepped part formed in the transmissive electrode layer 15 has a gradual inclination. Accordingly, the electrical performance is stabilized even when the transmissive electrode layer 15 is thinned.

Thus, for example, the opening 14A of the insulating layer 14 is preferred to have a side surface shape that narrows toward the p-type semiconductor layer 13P. The projection 13PB of the p-type semiconductor layer 13P is preferred to have a tapered shape toward the transmissive electrode layer 15.

Figure 6:
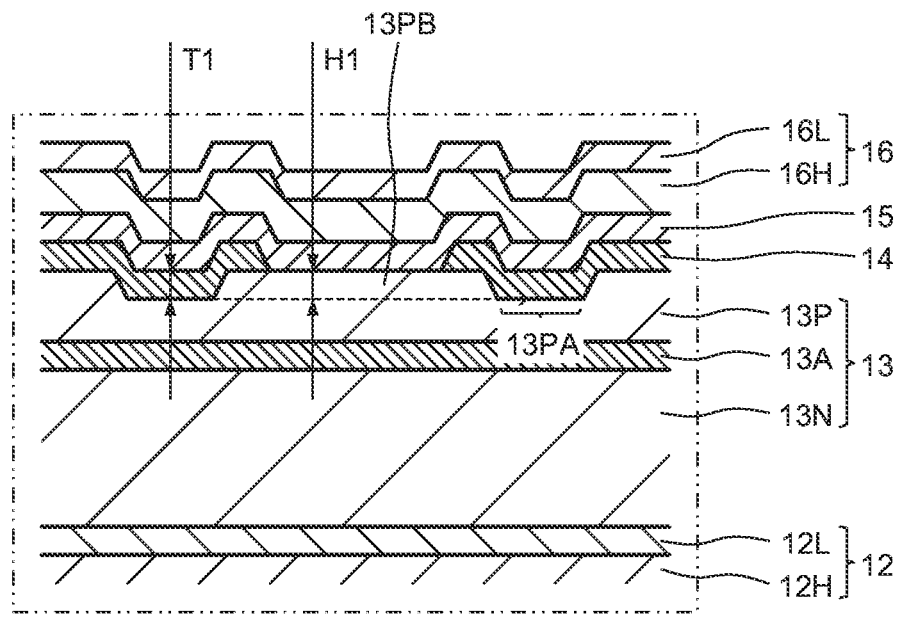
FIG. 6 is an enlarged cross-sectional view of the surface emitting laser according to Embodiment 1.

FIG. 6 is a cross-sectional view similar to FIG. 3 and FIG. 4. With reference to FIG. 6, a height H1 of the projection 13PB as a depth of the recess 13PA in the p-type semiconductor layer 13P and a layer thickness T1 of the insulating layer 14 inside the recess 13PA will be described.

In this embodiment, the insulating layer 14 has a refractive index lower than that of the light-emitting structure layer 13 including the p-type semiconductor layer 13P. In this case, the height H1 of the projection 13PB is preferred to be equal to or more than the layer thickness T1 of the insulating layer 14.

If the height H1 of the projection 13PB is less than the layer thickness T1 of the insulating layer 14, for example, if the insulating layer 14 is relatively thick, the effective refractive index of the outside ring-shaped region R3 is higher than the effective refractive index of the central region R1 in some cases. In this case, the relationship of the effective refractive indexes illustrated in FIG. 4 is no longer satisfied, and the light confinement effect in the transverse direction by the outside ring-shaped region R2 does not occur in some cases. Accordingly, this is because the laser oscillation itself becomes difficult in some cases.

For example, in this embodiment, the height H1 of the projection 13PB of GaN as the p-type semiconductor layer 13P is 20 nm, and the layer thickness T1 of $SiO_2$ as the insulating layer 14 is the same as this, 20 nm. The layer thickness of ITO as the transmissive electrode layer 15 is 20 nm. In this case, the distribution of the effective refractive indexes illustrated in FIG. 4 can be reliably formed.

For example, when the wavelength of the standing wave inside the resonator 10R is 445 nm, the refractive index of the $Nb_2O_5$ as a high refractive index dielectric film 16H1 at the lowermost layer as the wavelength adjustment layer is 2.484, the refractive index of ITO as the transmissive electrode layer 15 is 2.144, the refractive index of $SiO_2$ as the insulating layer 14 is 1.466, the refractive index of GaN as the light-emitting structure layer 13 is 2.54, and the resonator length of the resonator 10R is five times the wavelength of the standing wave (5λ resonator), the effective refractive index of the central region R1 is 2.52, the effective refractive index of the inside ring-shaped region R2 is 2.55, and the effective refractive index of the outside ring-shaped region R3 is 2.50.

In this embodiment, the case where the recess 13PA is formed on the surface of the p-type semiconductor layer 13P has been described. However, the recess 13PA (and the projection 13PB) is only necessary to be formed in the light-emitting structure layer 13.

In this embodiment, the case where the first reflecting mirror 12 is the semiconductor DBR and the second reflecting mirror 16 is the dielectric material DBR has been described. However, the configuration of the first and second reflecting mirrors 12 and 16 is not limited to this. For example, both the first and second reflecting mirrors 12 and 16 may be the semiconductor DBR or the dielectric material DBR, or the first reflecting mirror 12 may be the dielectric material DBR and the second reflecting mirror 16 may be the semiconductor DBR. The first and second reflecting mirrors 12 and 16 are only necessary to be various kinds of reflecting mirrors constituting the resonator 10R.

In this embodiment, the case where the insulating layer is formed to cover a part of the side surface of the light-emitting structure layer 13 has been described. However, the configuration of the insulating layer 14 is not limited to this. For example, the insulating layer 14 is only necessary to be formed on the upper surface of the p-type semiconductor layer 13P. That is, the insulating layer 14 is only necessary to have the opening 14A that exposes the p-type semiconductor layer 13P on the upper surface 13PT of the projection 13PB by covering the upper surface of the p-type semiconductor layer 13P and being terminated on the upper surface 13PT of the projection 13PB of the p-type semiconductor layer 13P.

In this embodiment, the case where the light-emitting structure layer 13 has the n-type semiconductor layer 13N on the first reflecting mirror 12 side and has the p-type semiconductor layer 13P on the insulating layer 14 side has been described. However, the light-emitting structure layer 13 may have a structure in which the p-type semiconductor layer 13P, the light-emitting layer 13A, and the n-type semiconductor layer 13N are stacked in this order on the first reflecting mirror 12. In this case, the recess 13PA and the projection 13PB are not necessarily disposed in the p-type semiconductor layer 13P, and, for example, it is only necessary for the recess 13PA and the projection 13PB to be disposed on the upper surface of the n-type semiconductor layer 13N.

Thus, in this embodiment, the surface emitting laser 10 includes the substrate 11, the first reflecting mirror 12 on the substrate 11, the n-type semiconductor layer 13N (the first semiconductor layer) formed on the first reflecting mirror 12, the light-emitting layer 13A formed on the n-type semiconductor layer 13N, and the p-type semiconductor layer 13P (the semiconductor layer having a conductivity type opposite of that of the first semiconductor layer) formed on the light-emitting layer 13A, having the ring-shaped recess 13PA on the upper surface, and having the projection 13PB defined by the inner end portion of the recess 13PA.

The surface emitting laser 10 includes the insulating layer 14 that covers the upper surface of the p-type semiconductor layer 13P and has the opening 14A terminated on the upper surface 13PT of the projection 13PB after passing through the recess 13PA to expose the p-type semiconductor layer 13P on the upper surface 13PT of the projection 13PB, the transmissive electrode layer 15 that covers the upper surface of the p-type semiconductor layer 13P exposed from the opening 14A and is formed on the insulating layer 14, and the second reflecting mirror 16 that is formed on the transmissive electrode layer 15 and constitutes the resonator 10R together with the first reflecting mirror 12. Accordingly, the surface emitting laser 10 that ensures emitting the light in the stable transverse mode can be provided.

In this embodiment, the case where the projection 13PB relatively projecting from the recess 13PA is formed by forming the ring-shaped recess 13PA on the surface of the p-type semiconductor layer 13P (the light-emitting structure layer 13) has been described. However, the upper surface shape of the light-emitting structure layer 13 is not limited to this. For example, the light-emitting structure layer 13 is only necessary to have the projection 13PB projecting from the surrounding regions.

Figure 7:
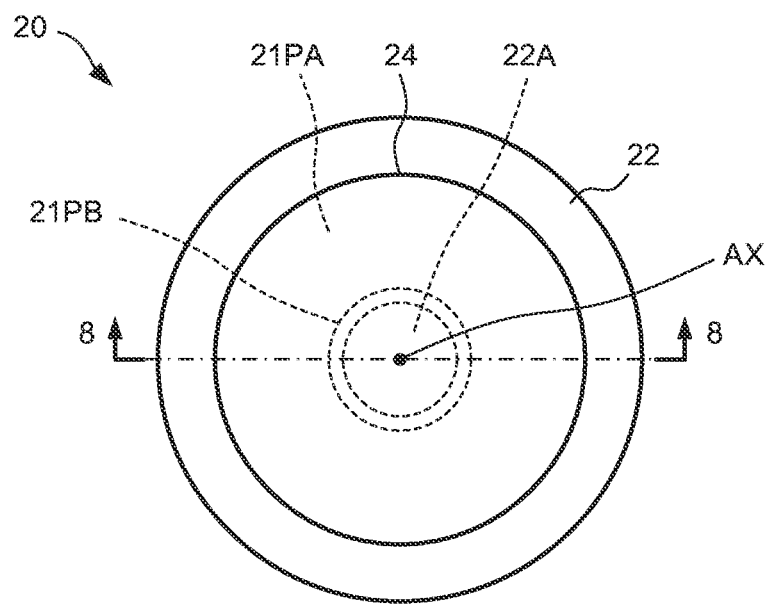
FIG. 7 is a top view of a surface emitting laser according to a modification of Embodiment 1.
Figure 8:
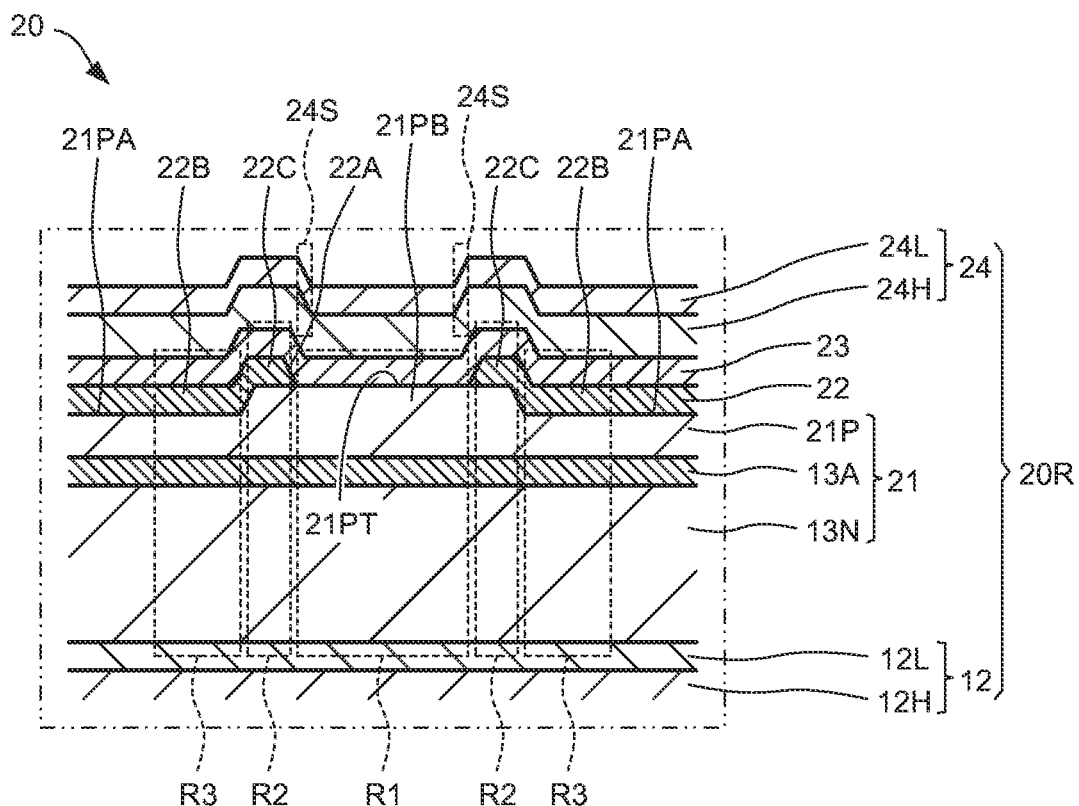
FIG. 8 is an enlarged cross-sectional view of the surface emitting laser according to the modification of Embodiment 1.

FIG. 7 is a top view of a surface emitting laser 20 according to a modification of Embodiment 1. FIG. 8 is a cross-sectional view of the surface emitting laser 20 and is a cross-sectional view along the line 8-8 in FIG. 7. With reference to FIG. 7 and FIG. 8, a configuration of the surface emitting laser 20 will be described.

The surface emitting laser 20 has a configuration similar to that of the surface emitting laser 10 except for a configuration of a light-emitting structure layer 21. In this modification, the light-emitting structure layer 21 has a configuration similar to that of the light-emitting structure layer 13 except for a configuration of a p-type semiconductor layer 21P.

Specifically, in this modification, the p-type semiconductor layer 21 has an evenly flat upper surface 21PA and a projection 21PB projecting from the upper surface 21PA. For example, the p-type semiconductor layer 21 can be formed by removing the entire surface of the p-type semiconductor layer 21 other than the region of the projection 21PB by a predetermined thickness.

For example, in consideration of forming the projection 13PB (the p-type semiconductor layer 13P) or 21PB (the p-type semiconductor layer 21P) by partially removing the surface of the semiconductor, providing the ring-shaped recess 13PA as in the p-type semiconductor layer 13P has more advantages in manufacturing since a removal amount of the semiconductor is less.

On the p-type semiconductor layer 21, an insulating layer 22 that is formed on an outer periphery portion of the upper surface 21PA and an upper surface 21PT of the projection 21PB in the p-type semiconductor layer 21 and has an opening 22A on the upper surface 21PT of the projection 21PB is formed. On the insulating layer 22, a transmissive electrode layer 23 is formed while burying the opening 22A. On the transmissive electrode layer 23, a second reflecting mirror 24 is formed.

The insulating layer 22 is made of a material similar to that of the insulating layer 14, and, for example, is made of $SiO_2$. The insulating layer 22 has a first part 22B formed on the upper surface 21PA of the p-type semiconductor layer 21 and a second part 22C formed on the upper surface 21PT of the projection 21PB.

The transmissive electrode layer 23 is made of a material similar to that of the transmissive electrode layer 15, and, for example, is made of ITO. The second reflecting mirror 24 has a high refractive index dielectric film 24H and a low refractive index dielectric film 24L made of materials similar to those of the high refractive index dielectric film 16H and the low refractive index dielectric film 16L, respectively, of the second reflecting mirror 16. For example, the high refractive index dielectric film 24H is made of $Nb_2O_5$ and the low refractive index dielectric film 24L is made of $SiO_2$.

Also in this modification, the insulating layer 22 is disposed such that the light-emitting structure layer 21 runs over the outer periphery portion of the projection 21PB projecting from the surrounding regions. This forms the central region R1 that corresponds to the region of the opening 22A of the insulating layer 22, and the inside ring-shaped region R2 and the outside ring-shaped region R3 that surround the central region R1 between the first and second reflecting mirrors 12 and 24. In the region on the central region R1 in the second reflecting mirror 24, an inclined region 24S caused by the step of the insulating layer 22 is formed.

Accordingly, the inside ring-shaped region R2 serves as a region to provide the waveguide loss and the inclined region 24S serves as a region to provide the mirror loss. Accordingly, the generation of the high-order transverse mode is effectively reduced, and, for example, the transverse mode can be stabilized even though the large current driving is performed.

Thus, in this modification, the surface emitting laser 20 includes the substrate 11, the first reflecting mirror 12 on the substrate 11, the n-type semiconductor layer 13N (the first semiconductor layer) formed on the first reflecting mirror 12, the light-emitting layer 13A formed on the n-type semiconductor layer 13N, and the p-type semiconductor layer 21P (the semiconductor layer having a conductivity type opposite of that of the first semiconductor layer) formed on the light-emitting layer 13A and having the projection 21PB on the upper surface 21PA.

The surface emitting laser 20 includes the insulating layer 22 that covers the upper surface 21PA of the p-type semiconductor layer 21P and has the opening 22A that exposes the p-type semiconductor layer 21P on the upper surface 21PT of the projection 21PB terminated on the upper surface 21PT of the projection 21PB, the transmissive electrode layer 23 that covers the upper surface of the p-type semiconductor layer 21P exposed from the opening 22A and is formed on the insulating layer 22, and the second reflecting mirror 24 that is formed on the transmissive electrode layer 23 and constitutes the resonator 20R together with the first reflecting mirror 12. Accordingly, the surface emitting laser 20 (the vertical cavity surface emitting device) that ensures emitting the light in the stable transverse mode can be provided.

DESCRIPTION OF REFERENCE SIGNS 10, 20 Surface emitting laser (vertical cavity surface emitting device)
13, 21 Light-emitting structure layer
13PB, 21PB Projection
14, 22 Insulating layer
15, 23 Transmissive electrode layer

The invention claimed is:

1. A vertical cavity surface emitting device comprising:
a substrate;
a first multilayer film reflecting mirror formed on the substrate;
a first semiconductor layer formed on the first multilayer film reflecting mirror, the first semiconductor layer having a first conductivity type;
a light-emitting layer formed on the first semiconductor layer;
a second semiconductor layer formed on the light-emitting layer, the second semiconductor layer having a second conductivity type opposite of the first conductivity type, and the second semiconductor layer having an upper surface with a projection;
an insulating layer that covers the upper surface of the second semiconductor layer, the insulating layer having an opening that exposes the second semiconductor layer on the upper surface of the projection terminated on the upper surface of the projection of the second semiconductor layer;
a transmissive electrode layer that covers the upper surface of the second semiconductor layer exposed from the opening of the insulating layer, the transmissive electrode layer being formed on the insulating layer; and
a second multilayer film reflecting mirror formed on the transmissive electrode layer, the second multilayer film reflecting mirror constituting a resonator together with the first multilayer film reflecting mirror,
wherein:
the second semiconductor layer has a ring-shaped recess on the upper surface, and
the projection of the second semiconductor layer is a part defined by an inner end portion of the recess.

2. The vertical cavity surface emitting device according to claim 1, wherein:
the insulating layer has a refractive index lower than a refractive index of the second semiconductor layer, and
the projection of the second semiconductor layer has a height equal to or more than a layer thickness of the insulating layer.

3. The vertical cavity surface emitting device according to claim 1, wherein:
the opening of the insulating layer has a side surface shape that narrows toward the second semiconductor layer, and
the second multilayer film reflecting mirror is formed on a region inside the opening of the insulating layer, and has an inclined region in which the multilayer films are inclined due to the side surface shape of the opening and stacked.

4. The vertical cavity surface emitting device according to claim 1, wherein:
the projection of the second semiconductor layer has a tapered shape toward the transmissive electrode layer.

5. The vertical cavity surface emitting device according to claim 1, wherein:
each of the first semiconductor layer, the light-emitting layer, and the second semiconductor layer is made of a nitride-based semiconductor,
the insulating layer is made of $SiO_2$,
the first multilayer film reflecting mirror is a distributed bragg reflector made of a semiconductor material, and
the second multilayer film reflecting mirror is a distributed bragg reflector made of a dielectric material.

* * * * *